United States Patent [19]
Lin et al.

[11] Patent Number: 6,124,177
[45] Date of Patent: Sep. 26, 2000

[54] METHOD FOR MAKING DEEP SUB-MICRON MOSFET STRUCTURES HAVING IMPROVED ELECTRICAL CHARACTERISTICS

[75] Inventors: Chrong Jung Lin, Taipei; Hung Der Su, Kao-Hsiung; Jong Chen, Taipei; Wen Ting Chu, Kao-Hsiung, all of Taiwan

[73] Assignee: Taiwan Semiconductor Manufacturing Company, Hsin-Chu, Taiwan

[21] Appl. No.: 09/373,635

[22] Filed: Aug. 13, 1999

[51] Int. Cl.$^7$ .................................................. H01L 21/336
[52] U.S. Cl. ........................ 438/305; 438/306; 438/182; 438/201; 438/319; 438/421; 438/574; 257/410; 257/522
[58] Field of Search .................................. 438/305, 182, 438/201, 319, 421, 574; 257/410, 522

[56] References Cited

U.S. PATENT DOCUMENTS

| | | | |
|---|---|---|---|
| 5,389,557 | 2/1995 | Jung-Suk | 437/44 |
| 5,736,446 | 4/1998 | Wu | 438/305 |
| 5,869,374 | 2/1999 | Wu | 438/291 |
| 5,869,379 | 2/1999 | Gardner et al. | 438/305 |
| 5,914,519 | 6/1999 | Chou et al. | 257/410 |
| 5,959,337 | 9/1999 | Gardner et al. | 257/410 |
| 5,972,763 | 10/1999 | Chou et al. | 438/305 |
| 6,002,150 | 12/1999 | Gardner et al. | 257/310 |
| 6,051,861 | 4/2000 | Togo | 257/340 |
| 6,064,107 | 5/2000 | Yeh | 257/522 |

OTHER PUBLICATIONS

Togo et al., "A Gate–Side Air–gap Structure (GAS) to Reduce the Parasite Capacitance in MOSFET's", VLSI Technical Proceedings, 1996, pp. 38–39.

Primary Examiner—Matthew Smith
Assistant Examiner—Belur Keshavan
Attorney, Agent, or Firm—George O. Saile; Stephen B. Ackerman

[57] ABSTRACT

A method for making improved MOSFET structures is achieved. A $Si_3N_4$ and a $SiO_2$ layer are deposited and patterned to have openings for gate electrodes over device areas on a substrate. A second $Si_3N_4$ layer is deposited and etched back to form arc-shaped sidewall spacers in the openings. An anti-punchthrough implant and a gate oxide are formed in the openings between the $Si_3N_4$ sidewall spacers. A polysilicon layer is deposited and polished back to form gate electrodes. The $SiO_2$ and the $Si_3N_4$ layers, including the sidewall spacers, are removed to form free-standing gate electrodes that increase in width with height, and having arc-shaped sidewalls. An implant through the edges of the arc-shaped gate electrodes results in lightly doped source/drains that are graded both in junction depth and dopant concentration to reduce hot electron effects. A second $SiO_2$ layer is deposited and etched back to form insulating sidewall spacers that include air spacers to reduce the gate-to-drain capacitance. Another implant is used to form source/drain contact areas. A salicide process is used which forms a silicide on the polysilicon gate electrodes and on the source/drain contact areas. The arc-shaped structure allows MOSFETs to be formed with reduced channel lengths while maintaining a wider silicide area on the gate electrodes for reduced resistance.

28 Claims, 3 Drawing Sheets

METHOD FOR MAKING DEEP SUB-MICRON MOSFET STRUCTURES HAVING IMPROVED ELECTRICAL CHARACTERISTICS

BACKGROUND OF THE INVENTION (1) Field of the Invention

The present invention relates to the fabrication of a novel MOSFET for integrated circuit devices on semiconductor substrates, and more particularly relates to a MOSFET structure having reduced channel lengths without reducing the gate suicide areas, and having improved short-channel effects including reduced gate-to-drain capacitance and improved source-to-drain punchthrough.

(2) Description of the Prior Art

Advances in the semiconductor process technologies in the past few years have dramatically decreased the device feature sizes and increased circuit density on integrated circuit chips. The device most used for Ultra Large Scale Integration (ULSI) is the Field Effect Transistor (FET), having a silicon or silicon and metal-silicide (polycide) gate electrode with self-aligned source/drain contact areas. Commonly referred to as MOSFETs (Metal-Oxide-Silicon FETs) because of the early use of a metal as the gate electrode, these three terminal devices are now made using polycide for the gate electrodes, and more recently use shallow silicide contacts for the source/drain areas. The popular choice of FETs is because of their low cost, very small size, high packing density, low power consumption, and high yields.

The conventional FETs are typically fabricated by patterning polysilicon gate electrodes over a thin gate oxide on a single-crystal semiconductor substrate. The gate electrode structure is used as a diffusion or implant barrier mask to form self-aligned source/drain areas in the substrate adjacent to the sides of the gate electrodes. The distance from the source junction to drain junction under the gate electrodes is defined as the channel length of the FET.

Advances in semiconductor technologies, such as high-resolution photolithographic techniques and anisotropic plasma etching, to name a few, have reduced the minimum feature sizes of devices to much less than a micrometer. Currently in the industry, FETs are made having channel lengths that are less than a quarter-micrometer (about 0.25 um) in length, and in future product the channel length is expected to decrease further to 0.18 um and less.

However, as this downscaling continues and the channel length is further reduced, the FET device experiences a number of undesirable electrical characteristics known as short channel effects (SCE). These short channel effects become more severe as the device physical dimensions and, more specifically, as the FET channel length is scaled down. This result is due to the fact that the band gap and built-in potential at junctions are an intrinsic property (constant) of the crystalline materials (such as silicon), and are non-scalable with the further reduction in device dimensions.

These adverse short channel effects result from the electric field distribution in the channel area when the integrated circuit is powered up, which lead to a number of problems. For example, electrons ejected from the drain can acquire sufficient energy to be injected into the gate oxide resulting in charge buildup in the oxide that causes threshold voltage shifts. Unfortunately, this hot carrier effect (HCE) can degrade device performance after the product is in use (at the customer). Other effects that can limit device performance are the parasitic capacitance, such as gate-to-drain capacitance, fringing capacitance at the edge of the gate electrode, and the junction capacitance at the source/drain diffused junctions.

One method of minimizing these short channel effects, common practice in the semiconductor industry, is to fabricate FET structures with Lightly Doped Drains (LDDs). These LDD FET structures have low dopant concentrations in the drain regions adjacent to the gate electrodes, and modify the electric fields in the drains so as to minimize or eliminate short channel effects, such as hot carrier effects. Another problem is punchthrough between the source and drain as the channel length is scaled down. Typically an anti-punchthrough implant is introduced in the substrate under the gate oxide to minimize this effect.

The LDD FETs are typically formed by using two ion implantations. After forming the polysilicon gate electrodes, a first implant, using the gate electrodes as an implant mask, is carried out to form lightly doped source/drain regions adjacent to the gate electrodes. Sidewall spacers are then formed on the gate electrodes and a second implant is used to form the heavily doped source/drain regions.

Several methods of improving the FET electrical characteristics have been reported in the literature. One method is reported in a paper titled "A Gate-Side Air-Gap Structure (GAS) to Reduce the Parasitic Capacitance in MOSFETS" in VLSI Technical Proceedings, 1996, on page 38. In this paper, the advantage of using an air gap between the side of the gate electrode and the sidewall spacer to reduce capacitance between the gate and drain ($C_{gd}$), commonly referred to as Miller capacitance, to improve the gate delay time was reported.

Several methods for making FETs with air gaps include U.S. Pat. No. 5,869,374 to Wu, U.S. Pat. No. 5,869,479 to Gardner et al., and U.S. Pat. No. 5,736,446 to Wu.

However, there is still a strong need in the semiconductor industry to further improve the electrical characteristics as the FET channel length continues to decrease below 0.25 um, and still maintaining a cost-effective manufacturing process.

SUMMARY OF THE INVENTION

A principal object of this invention is to provide a new and improved MOSFET having deep sub-micrometer channel lengths and graded lightly doped drain profiles to reduce unwanted hot carrier effects (damage).

Another object of this invention is to provide an FET structure having an air spacer that reduces the Miller capacitance between the gate electrodes and drain areas of the FET.

Still another object of this invention is to provide a reduced channel length that exceeds the present lithography resolution without reducing the gate silicide area thereby maintaining a low sheet resistance on the gate electrodes.

Yet another objective of this invention is to provide an FET with a delta-doped channel profile that minimizes punchthrough and reduces junction capacitance.

In accordance with the above objects of this first embodiment, a method for fabricating improved deep sub-micrometer FETs having air spacers (also referred to in the industry as air gaps) is now described briefly. These improved MOSFET devices utilize a disposable sidewall spacer in a recess or opening in an insulating layer to achieve all of the above objectives.

The method for forming these MOSFETs begins by providing a single-crystal semiconductor substrate having device areas that are typically surrounded and electrically isolated by field oxide areas. The method described here is for an N-channel FET on a P doped substrate (for example, doped with boron) having gate electrodes and source/drain areas formed using an N type dopant such as arsenic (As) or phosphorus (P). However, it should be understood that by reversing the polarity of the dopants, P-channel FETs can also be formed with these improved short channel effect characteristics. A first insulating layer, composed of silicon nitride, is deposited and then a second insulating layer, composed of silicon oxide, is deposited on the first insulating layer. The first and second insulating layers are patterned to form openings for FET gate electrodes over and to the device areas on the substrate. A conformal third insulating layer, composed of silicon nitride, is deposited and is anisotropically etched back to form arc-shaped first sidewall spacers on the sidewalls in the openings. For the N-channel MOSFETs, a P type dopant, such as boron (B), is implanted in the exposed substrate in the openings to form anti-punchthrough doped regions. A thin gate oxide is formed, for example by thermal oxidation, on the device areas in the openings. An undoped polysilicon layer is deposited to fill the openings and is polished back to form polysilicon gate electrodes in the openings aligned over the gate oxide. The $SiO_2$ second insulating layer is completely removed by selectively etching in a hydrofluoric (HF) acid solution or by vapor etching. Next, the $Si_3N_4$ first insulating layer and the $Si_3N_4$ arc-shaped first sidewall spacers are selectively etched in a hot phosphoric acid etch. This etching leaves free-standing polysilicon gate electrodes having a shape determined by the $Si_3N_4$ arc-shaped sidewall spacers. The polysilicon gate electrodes having these arc-shaped sidewalls gradually increase in width as a function of increasing height above the gate oxide. The gate electrodes are aligned over the gate oxide. And the width of the gate electrodes at the bottom is narrower than the resolution limits of the photoresist mask used to etch the openings, and therefore the next generation of MOSFETs (<0.25 um) can be achieved using the present lithographic tools and techniques having a resolution of 0.25 um. Next, the lightly doped source/drain areas are implanted adjacent to the gate electrodes and concurrently dopes the gate electrodes. Because of the arc-shape of the gate electrodes, the lightly doped source/drain areas are also implanted through the edge of the gate electrodes to form graded, lightly doped source/drain areas adjacent to the gate oxide. A fourth insulating layer, preferably $SiO_2$, is deposited and anisotropically etched back to form second sidewall spacers and air spacers adjacent to the gate electrodes. The air spacer between the gate electrode and the second sidewall spacer has a dielectric constant k of about 1.0, compared to $SiO_2$ which has a k of about 4.5. Therefore, the Miller capacitance ($C_{gd}$) is significantly reduced. Heavily $N^+$ doped source/drain contact areas are formed adjacent to the second sidewall spacers, for example, by implanting arsenic or phosphorus ions and concurrently the implant is used to further dope the gate electrodes. The N-channel MOSFETs are now completed using a salicide process, which involves depositing and annealing a titanium metal layer to form a metal silicide on the polysilicon gate electrodes and on the source/drain contact areas. The unreacted metal on the oxide surfaces is then selectively removed. By reversing the polarity of the dopants, P-channel MOSFETs can be made in like fashion.

BRIEF DESCRIPTION OF THE DRAWINGS

The object and other advantages of the invention will become more apparent in the preferred embodiment when read in conjunction with the following drawings.

DESCRIPTION OF THE PREFERRED EMBODIMENT

In accordance with the objects of this invention, a method and structure are provided for making improved sub-micron MOSFETs having reduced short channel effects. The method is described for making N-channel MOSFETs. However, it should be well understood by one skilled in the art that by reversing the polarity of the dopants, P-channel MOSFETs can be made. Further, by including additional photoresist masking steps, the N-channel and P-channel MOSFETs can be formed concurrently on the same substrate for CMOS circuit applications. The MOSFETs are formed in device areas that are defined in and on a substrate by forming a relatively thick field oxide that surrounds and electrically isolates these device areas. The field oxide is not shown to simplify the drawings and the discussion, but is generally formed by conventional means as is well known in the industry for forming, for example, shallow trench isolation.

Figure 1:
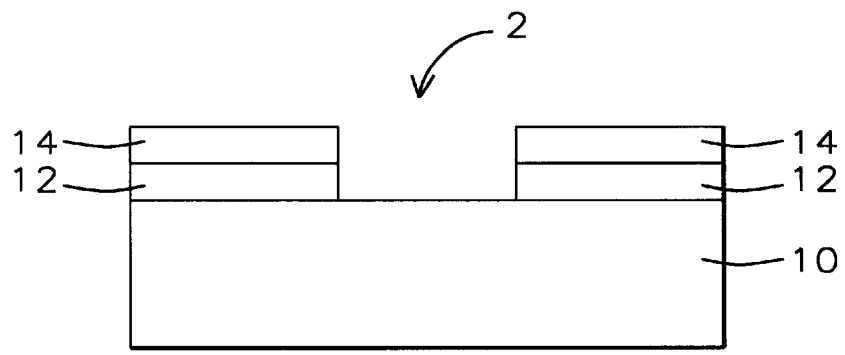
FIGS. 1 through 8 show schematically in cross-sectional representation the preferred embodiment of the invention for fabricating N-channel MOSFETs having improved short-channel effects.

Referring to FIG. 1, the method begins by providing a substrate 10, a portion of which is shown. The substrate 10 is typically a single-crystal silicon having a <100> crystallographic orientation and is conductively doped with a P type dopant, such as boron (B). A first insulating layer 12 is deposited. Layer 12 is preferably $Si_3N_4$ and is deposited by low-pressure chemical vapor deposition (LPCVD), using dichlorosilane ($SiCl_2H_2$) and ammonia ($NH_3$) as the reactant gases, to a thickness of between about 400 and 1000 Angstroms. A second insulating layer 14 is then deposited on the first insulating layer 12. Layer 14 is preferably $SiO_2$ and is deposited by low-pressure chemical vapor deposition (LPCVD), using tetraethosiloxane (TEOS) as the reactant gas. The second insulating layer 14 is deposited to a thickness of between about 500 and 800 Angstroms. The first and second insulating layers 12 and 14 are patterned using conventional photolithographic techniques and anisotropic etching to form openings 2 for FET gate electrodes over and to the device areas on the substrate 10. The openings 2 are etched using high-density plasma etching and an etchant gas mixture containing $CF_4$ or $C_2F_6$ that etches $Si_3N_4$ 12 selectively to the silicon substrate 10.

Figure 2:
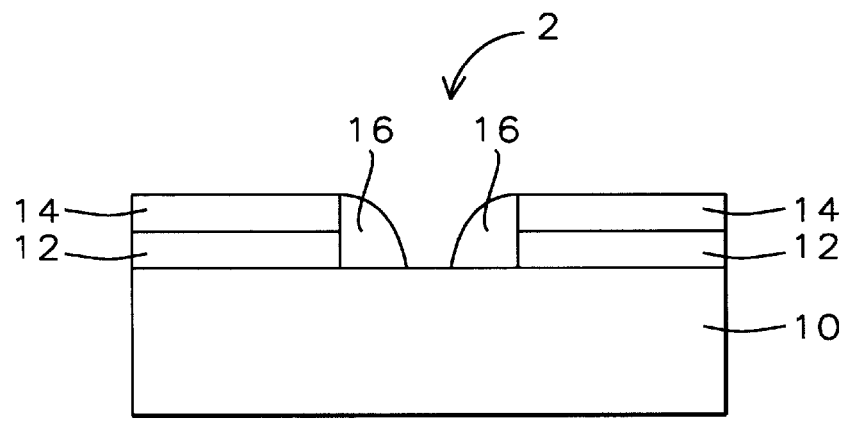

Referring to FIG. 2, a conformal third insulating layer 16, also composed of $Si_3N_4$, is deposited and is anisotropically etched back to form arc-shaped first sidewall spacers, also labeled 16, on the sidewalls of layers 12 and 14 in the openings 2. Layer 16 is deposited by LPCVD using $SiCl_2H_2$ and $NH_3$. The third insulating layer is etched back using an etchant gas mixture containing $CF_4$ or $C_2F_6$ to form the arc-shaped sidewall spacers 16, as shown in FIG. 2. For example, if the minimal spacing (width) of the opening 2 is about 0.25 micrometers (um), then the $Si_3N_4$ sidewall spacers 16 have a preferred width of between about 500 and 1000 Angstroms.

Figure 3:
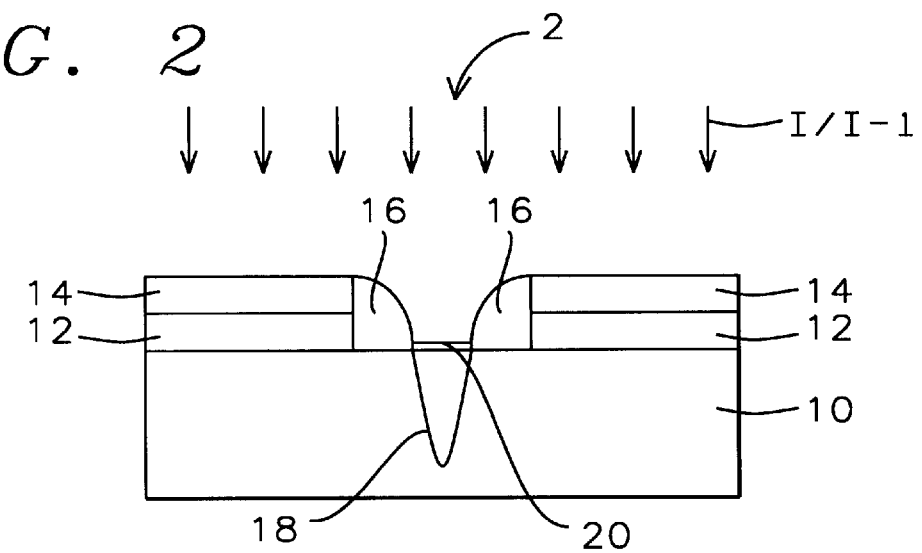

Referring to FIG. 3, for making the N-channel MOSFETs, a P type dopant, such as boron (B), is implanted in the exposed silicon substrate 10 in the openings 2 to form anti-punchthrough doped regions 18. The implant is preferably carried out at an implant dose of between about 1.0 E 12 and 7.0 E 13 atoms/$cm^2$ and at an implant energy of between about 25 and 60 KeV, and is shown in FIG. 3 as vertical arrows labeled I/I-1. Insulating layers 12, 14, and 16 serve as an implant mask and define the implant profile (approximately delta-shaped). Next, a thin gate oxide 20 is formed on the substrate surface 10 aligned over the implanted region 18. For example, the gate oxide 20 can be formed by thermal oxidation in an oxidation furnace, typically, using a dry oxygen at a temperature of about 800 to 900° C. The gate oxide 20 is grown to a thickness of between about 20 and 40 Angstroms.

Figure 4:
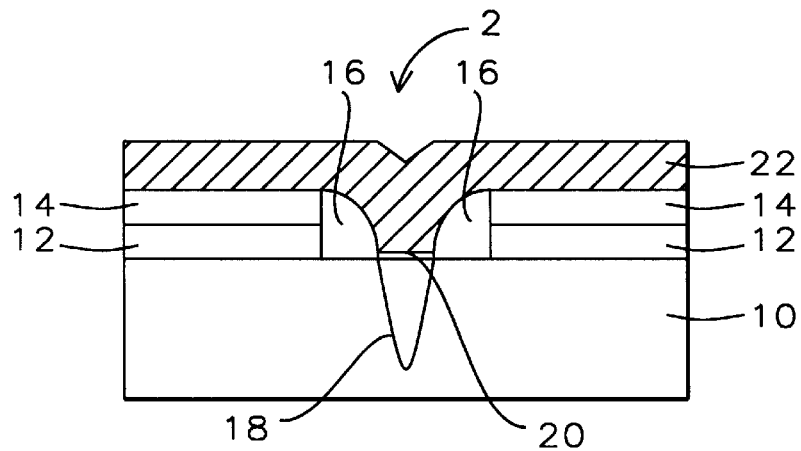

Referring to FIG. 4, an undoped polysilicon layer 22 is deposited to a thickness sufficient to fill the openings 2. Layer 22 is preferably deposited by LPCVD using silane ($SiH_4$) as the reactant gas.

Figure 5:
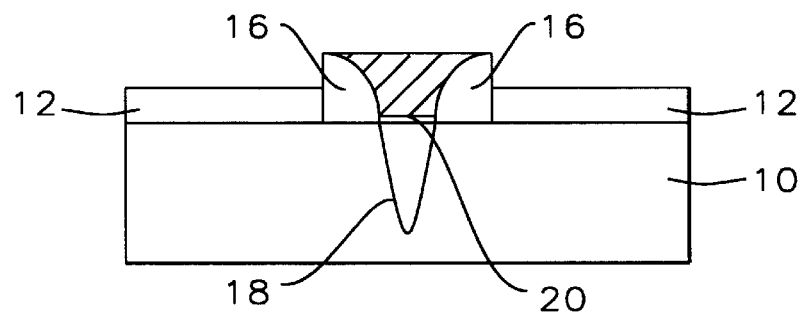

Referring now to FIG. 5, polysilicon layer 22 is chemically-mechanically polished back to the second insulating surface 14 to form polysilicon gate electrodes 22 in the openings 2 aligned over the gate oxide 20. Next, the $SiO_2$ second insulating layer 14 is removed by selective etching. For example, layer 14 can be removed by using a hydrofluoric (HF) acid solution or by using an HF vapor etching technique.

Figure 6:
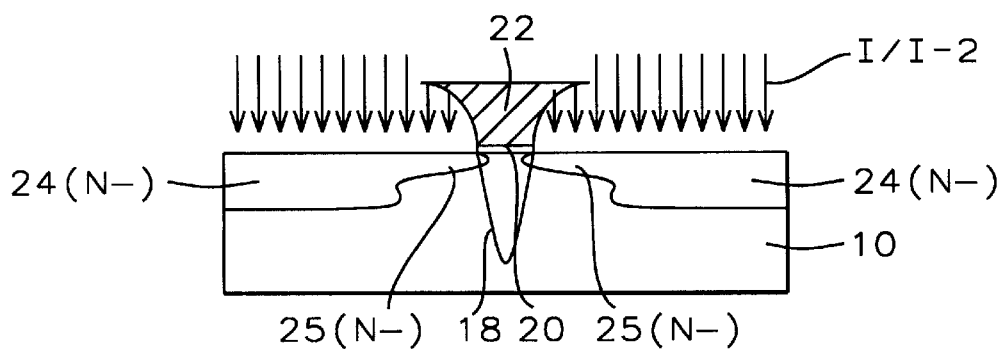
Figure 7:
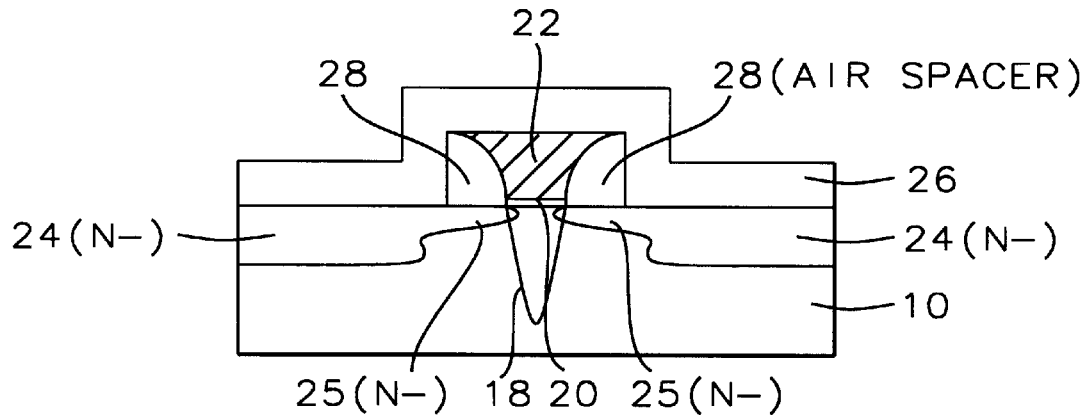

Referring to FIG. 6, the exposed $Si_3N_4$ first insulating layer 12 and the $Si_3N_4$ arc-shaped first sidewall spacers 16 are selectively removed by etching in a hot phosphoric acid etch. The etching is typically carried out at a temperature of about 150° C. The removal of the $Si_3N_4$ layer 12 and sidewall spacers 16 results in free-standing polysilicon gate electrodes 22 having arc-shaped sidewalls as determined by the $Si_3N_4$ arc-shaped sidewall spacers 16, as depicted in FIG. 6. Next, for the N-channel MOSFETs, lightly doped source/drain (LDD) areas 24($N^-$) are formed by implanting $As^{75}$ or $P^{31}$ ions, as depicted by the vertical arrows labeled I/I-2 in FIG. 6. The implant is carried out at a dose of between about 1.0 E 14 and 8.0 E 14 atoms/$cm^2$ and at an implant energy of between about 30 and 60 KeV to provide a dopant concentration of between about 5.0 E 18 and 5.0 E 19 atoms/$cm^3$ adjacent to the gate electrodes 22. Concurrently the gate electrodes 22 are also conductively doped during this implant step. Because of the arc-shape of the polysilicon gate electrodes (gradual increase in width as a function of increasing height above the gate oxide), the lightly doped source/drain areas are also implanted through the edge of the gate electrodes 22 to form graded, lightly doped source/drain areas 25($N^-$) adjacent to the gate oxide 20 and that are shallower in depth and lower in dopant concentration than the LDD areas 24($N^-$). These improved graded, lightly doped source/drain areas 25($N^-$) reduce the hot electron effect, while the anti-punchthrough region 18 reduces the punchthrough from source to drain. The gate electrodes 22 are also doped Referring to FIG. 7, a fourth insulating layer 26 is deposited. Layer 26 is preferably a high-aspect-ratio $SiO_2$ and is deposited by plasma-enhanced CVD, or sub-atmospheric (SA) CVD or atmospheric pressure (AP) CVD. For example, layer 26 can be deposited by PECVD using a reactant gas such as $SiH_4$ or $SiCl_2H_2$ and $O_2$ $N_2O_2$ and can be deposited using a deposition tool, such as Centura or P5000 manufactured by Applied Materials Company of U.S.A. The fourth insulating layer 26 is deposited to a thickness of between about 1400 and 2200 Angstroms. The deposition of the high-aspect-ratio $SiO_2$ results in air spacers 28 being formed adjacent to the polysilicon gate electrodes 22. The air spacers 28 reduce the Miller (fringe) capacitance ($C_{gd}$) between the gate electrode 22 and source/drain areas 25($N^-$) because the dielectric constant k for air (or vacuum) is about 1.0 compared to a $SiO_2$ spacer that has a k of about 4.5.

Figure 8:
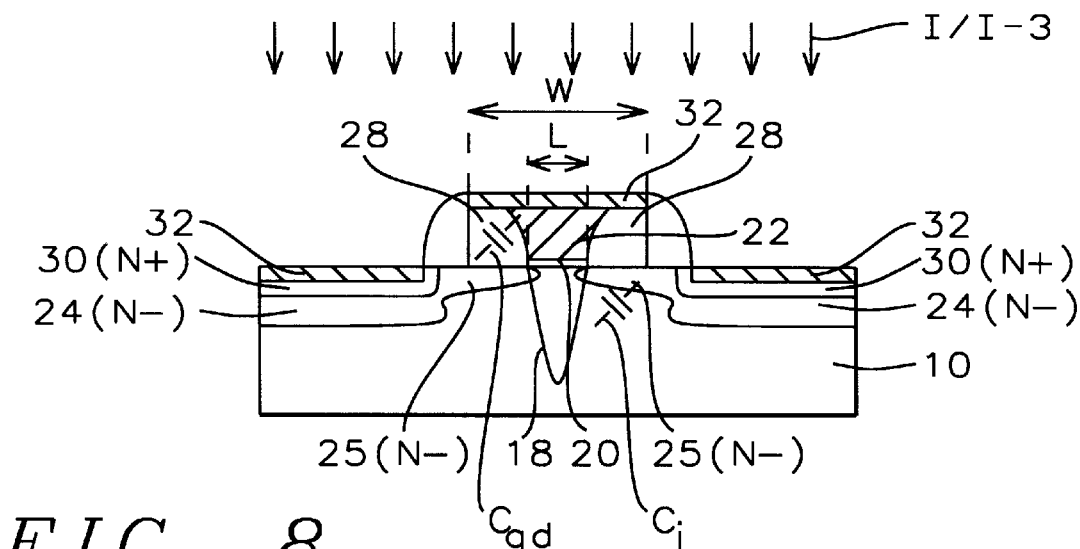

Referring to FIG. 8, the fourth insulating layer 26 is anisotropically etched back to form second sidewall spacers 26 while retaining the air spacers 28 adjacent to the gate electrodes 22. The etching is carried out preferably using HDP etching or reactive ion etching using an etchant gas mixture containing $C_2F_6$ or $CF_4$ that selectively etches the $SiO_2$ 26 to the silicon substrate 10.

Continuing with FIG. 8, heavily $N^+$ doped source/drain contact areas 30($N^+$) are formed adjacent to the second sidewall spacers 26. For example, the source/drain contact areas 30($N^+$) can be formed by implanting $As^{75}$ or $P^{31}$ ions to have a final concentration of between about 2.0 E 20 and 6.0 E 20 atoms/$cm^3$, and as depicted by the vertical arrows labeled I/I-3 in FIG. 8. Concurrently the gate electrodes 22 are doped by this implant step to further increase the electrical conductivity.

Still referring to FIG. 8, the N-channel MOSFETs are now completed using a salicide process. The salicide process involves depositing a thin metal layer 32, such as titanium (Ti). One method of depositing the Ti is by physical vapor deposition, such as by sputtering from a Ti target. The Ti layer 32 is deposited to a preferred thickness of between about 215 and 275 Angstroms. The Ti is reacted by rapid thermal anneal at a temperature of between about 700 and 815° C. for about 20 seconds to form a titanium silicide ($TiSi_x$) on the polysilicon gate electrodes 22 and on the source/drain contact areas 30($N^+$). The unreacted Ti metal on the oxide surfaces, which include the sidewall spacers 26, is selectively removed by etching in a solution of $NH_4OH$ and $H_2O_2$. After removing the unreacted Ti, a second rapid thermal anneal is carried out at a temperature of between about 800 and 875° C. for about 60 seconds to complete the reaction and to reduce the sheet resistance of the $TiSi_x$ 32. Since the width W of the gate electrode at the top is substantially wider than the width of the gate electrode at the bottom (approximately equal to the channel length L), the resistance of the gate electrode is improved over the more conventional FET gate electrodes.

Since the polysilicon gate electrode 22 is narrower at the bottom than the resolution limits of the photoresist mask used to etch the openings 2, the current photoresist technology can be used to fabricate the next generation of MOSFET devices (having channel lengths less than 0.25 um). The air spacer 28 minimizes the Miller capacitance $C_{gd}$ and the taped lightly doped source/drain areas 25($N^-$) reduce the junction capacitance $C_j$, as depicted in FIG. 8.

While the invention has been particularly shown and described with reference to the preferred embodiment thereof, it will be understood by those skilled in the art that various changes in form and details may be made without departing from the spirit and scope of the invention. For example, by reversing the polarity of the conductive type dopants and appropriately selecting the dopant concentrations, it is possible to fabricate a P channel MOSFET by the method of this invention.

What is claimed is:

1. A method for fabricating improved MOSFET devices on a semiconductor substrate having device areas comprising the steps of:

depositing a first insulating layer and a second insulating layer and patterning to form openings for FET polysilicon gate electrodes over said device areas;

depositing and etching back a third insulating layer to form arc-shaped first sidewall spacers in said openings;

implanting an anti-punchthrough dopant in said substrate between said first sidewall spacers; forming a gate oxide on said device areas in said openings;

depositing a polysilicon layer and polishing back to form polysilicon gate electrodes in said openings aligned over said gate oxide;

isotropically etching said second insulating layer, said first insulating layer, and said arc-shaped first sidewall spacers, leaving free-standing said polysilicon gate electrodes having a shape determined by said arc-shaped sidewall spacers, whereby said polysilicon gate electrodes gradually increase in width as a function of increasing height from said gate oxide;

ion implanting a dopant through said polysilicon gate electrodes to form graded, lightly doped source/drain areas adjacent to said gate oxide and concurrently doping said gate electrodes;

depositing and anisotropically etching back a fourth insulating layer to form second sidewall spacers and air spacers adjacent to said gate electrodes;

ion implanting source/drain con tact areas adjacent to said second sidewall spacers and concurrently doping said polysilicon gate electrodes;

depositing and annealing a metal layer to form a metal silicide on said polysilicon gate electrodes and on said source/drain contact areas and removing said metal that is unreacted to complete said MOSFET devices.

2. The method of claim 1, wherein said first insulating layer is silicon nitride deposited by low-pressure chemical vapor deposition to a thickness of between about 400 and 1000 Angstroms.

3. The method of claim 1, wherein said second insulating layer is silicon oxide deposited by low-pressure chemical vapor deposition to a thickness of between about 500 and 800 Angstroms.

4. The method of claim 1, wherein said third insulating layer is silicon nitride deposited by low-pressure pressure chemical vapor deposition to a thickness of between about 700 and 900 Angstroms.

5. The method of claim 1, wherein said anti-punchthrough dopant for N-channel FET is a P type dopant, and is implanted at a dose of between about 1.0 E 12 and 7.0 E 13 atoms/cm$^2$ and at an implant energy of between about 25 and 60 KeV.

6. The method of claim 1, wherein said second insulating layer is isotropically etched using hydrofluoric acid.

7. The method of claim 1, wherein said first and third insulating layers are removed using a hot phosphoric acid etch.

8. The method of claim 1, wherein said polysilicon layer is deposited by low-pressure chemical vapor deposition using silane as the reactant gas.

9. The method of claim 1, wherein said lightly doped source/drain areas are doped with an N type dopant at a dose of between about 1.0 E 14 and 8.0 E 14 atoms/cm$^2$ and at an implant energy of between about 30 and 60 KeV.

10. The method of claim 1, wherein said fourth insulating layer is silicon oxide deposited by low-pressure chemical vapor deposition to a thickness of between about 1400 and 3200 Angstroms.

11. The method of claim 1, wherein said metal is titanium deposited to a thickness of between about 215 and 275 Angstroms.

12. The method of claim 1, wherein said punchthrough implant is an N type dopant, and said lightly doped source/drain areas and said source/drain contact areas are implanted with a P type dopant, and said MOSFET devices are P-channel FETs.

13. A method for fabricating improved MOSFET devices on a semiconductor substrate having device areas comprising the steps of:

depositing a first insulating layer composed of silicon nitride and a second insulating layer composed of silicon oxide, and patterning to form openings for FET gate electrodes over said device areas;

depositing and etching back a third insulating layer composed of silicon nitride to form arc-shaped first sidewall spacers in said openings;

implanting an anti-punchthrough dopant in said substrate between said first sidewall spacers; forming a gate oxide on said device areas in said openings;

depositing a polysilicon layer and polishing back to form gate electrodes in said openings aligned over said gate oxide;

isotropically etching said second insulating layer, said first insulating layer, and said arc-shaped first sidewall spacers, leaving free-standing said polysilicon gate electrodes having a shape determined by said arc-shaped sidewall spacers, whereby said polysilicon gate electrodes gradually increase in width as a function of increasing height from said gate oxide;

ion implanting a dopant through said gate electrodes to form graded, lightly doped source/drain areas adjacent to said gate oxide and concurrently doping said gate electrodes;

depositing and anisotropically etching back a fourth insulating layer to form second sidewall spacers and air spacers adjacent to said gate electrodes;

ion implanting source/drain contact areas adjacent to said second sidewall spacers and concurrently doping said gate electrodes;

depositing and annealing a titanium metal layer to form a metal silicide on said polysilicon gate electrodes and on said source/drain contact areas and removing said metal that is unreacted to complete said MOSFET devices.

14. The method of claim 13, wherein said first insulating layer is deposited by low-pressure chemical vapor deposition to a thickness of between about 400 and 1000 Angstroms.

15. The method of claim 13, wherein said second insulating layer is deposited by low-pressure chemical vapor deposition to a thickness of between about 500 and 800 Angstroms.

16. The method of claim 13, wherein said third insulating layer is deposited by low-pressure chemical vapor deposition to a thickness of between about 700 and 900 Angstroms.

17. The method of claim 13, wherein said anti-punchthrough dopant for N-channel FET is a P type dopant, and is implanted at a dose of between about 1.0 E 12 and 7.0 E 13 atoms/cm$^2$ and at an implant energy of between about 25 and 60 KeV.

18. The method of claim 13, wherein said second insulating layer is isotropically etched using hydrofluoric acid.

19. The method of claim 13, wherein said first and third insulating layers are removed using a hot phosphoric acid etch.

20. The method of claim 13, wherein said polysilicon layer is deposited by low-pressure chemical vapor deposition using silane as the reactant gas.

21. The method of claim 13, wherein said lightly doped source/drain areas are doped with an N type dopant at a dose of between about 1.0 E 14 and 8.0 E 14 atoms/cm$^2$ and at an implant energy of between about 30 and 60 KeV.

22. The method of claim 13, wherein said fourth insulating layer is silicon oxide deposited by low-pressure chemical vapor deposition to a thickness of between about 1400 and 3200 Angstroms.

23. The method of claim 13, wherein said titanium metal is deposited to a thickness of between about 215 and 275 Angstroms.

24. The method of claim 13, wherein said punchthrough implant is an N type dopant, and said lightly doped source/drain areas and said source/drain contact areas are implanted with a P type dopant, and said MOSFET devices are P-channel FETs.

25. An improved MOSFET device over device areas on a semiconductor substrate comprised of:

- polysilicon gate electrodes aligned over a gate oxide and an anti-punchthrough doped region in said substrate aligned under said gate oxide;
- said gate electrodes having arc-shaped sidewalls that increase outward with increasing height from said gate oxide and said arc-shaped sidewalls extending over lightly doped source/drain areas;
- lightly doped source and drains having increasing dopant concentration and increasing junction depth graded to extend away from edge of said gate oxide;
- insulating sidewall spacers extending vertically downward from top edge of said gate electrodes to said substrate that form air spacers between said insulating sidewall spacers and said arc-shaped sidewalls of said polysilicon gate electrodes;
- source/drain contacts in said substrate adjacent to outer portions of said insulating sidewall spacers;
- a metal silicide on top surface of said gate electrodes and on said source/drain contacts.

26. The structure of claim 25, wherein said polysilicon gate electrodes are doped with an N type dopant during implantation of said source/drain areas.

27. The structure of claim 25, wherein said lightly doped source/drain areas are doped with an N type dopant by ion implanting through said arc-shaped sidewalls of said gate electrodes.

28. The structure of claim 25, wherein said metal silicide is titanium silicide.

* * * * *